United States Patent
Hinks et al.

(10) Patent No.: US 6,492,815 B2
(45) Date of Patent: Dec. 10, 2002

(54) METHOD AND APPARATUS FOR EVALUATING SIGNALS PRODUCED IN A MAGNETIC RESONANCE IMAGING SYSTEM

(75) Inventors: Richard Scott Hinks, Waukesha, WI (US); John E. Lorbiecki, Sr., Hubertus, WI (US); Robert S. Stormont, Hartland, WI (US); Cherik Bulkes, Sussex, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/748,576

(22) Filed: Dec. 22, 2000

(65) Prior Publication Data

US 2002/0113591 A1 Aug. 22, 2002

(51) Int. Cl.$^7$ .................................................. G01V 3/00
(52) U.S. Cl. .................... 324/318; 324/322; 324/320
(58) Field of Search ............................. 324/318, 307, 324/309, 322, 320

(56) References Cited

U.S. PATENT DOCUMENTS

| | | | | |
|---|---|---|---|---|
| 4,812,764 A | * | 3/1989 | Bendall | 324/318 |
| 4,837,511 A | * | 6/1989 | Whittington et al. | 324/327 |
| 4,928,063 A | * | 5/1990 | Lampman et al. | 324/307 |
| 5,281,914 A | * | 1/1994 | Conturo et al. | 324/309 |
| 5,304,931 A | * | 4/1994 | Flaming et al. | 324/309 |
| 5,581,181 A | * | 12/1996 | Fuderer | 324/309 |
| 5,696,441 A | * | 12/1997 | Mak et al. | 324/115 |
| 5,759,152 A | * | 6/1998 | Felmlee et al. | 324/309 |
| 6,087,831 A | * | 7/2000 | Bornert et al. | 324/307 |
| 6,211,675 B1 | * | 4/2001 | Ganin et al. | 324/318 |
| 6,288,540 B1 | * | 9/2001 | Chen et al. | 324/300 |
| 6,300,733 B1 | * | 10/2001 | Bergstrom | 318/128 |
| 6,313,630 B1 | * | 11/2001 | Ganin et al. | 324/312 |

* cited by examiner

Primary Examiner—Edward Lefkowitz
Assistant Examiner—Dixomara Vargas
(74) Attorney, Agent, or Firm—Quarles & Brady LLP

(57) ABSTRACT

A plurality of magnetic field induction coils and a radio frequency (RF) detection coil are supported by a frame which is inserted into the bore of an MRI system to detect magnetic fields produced by gradient pulses and RF pulses produced during a scan. The detected magnetic fields are processed to produce gradient waveforms and RF pulse waveforms that are displayed to the user.

20 Claims, 4 Drawing Sheets

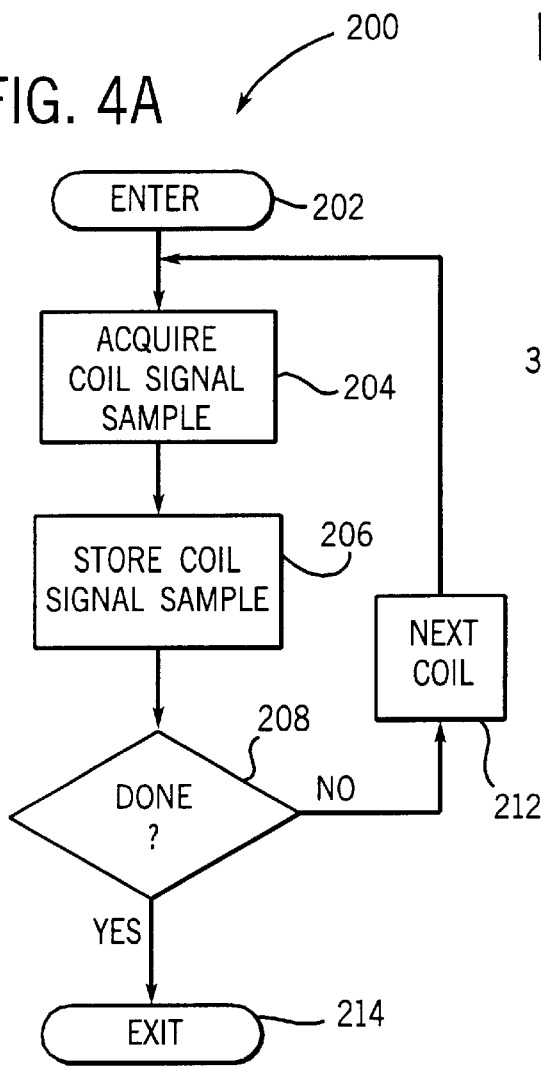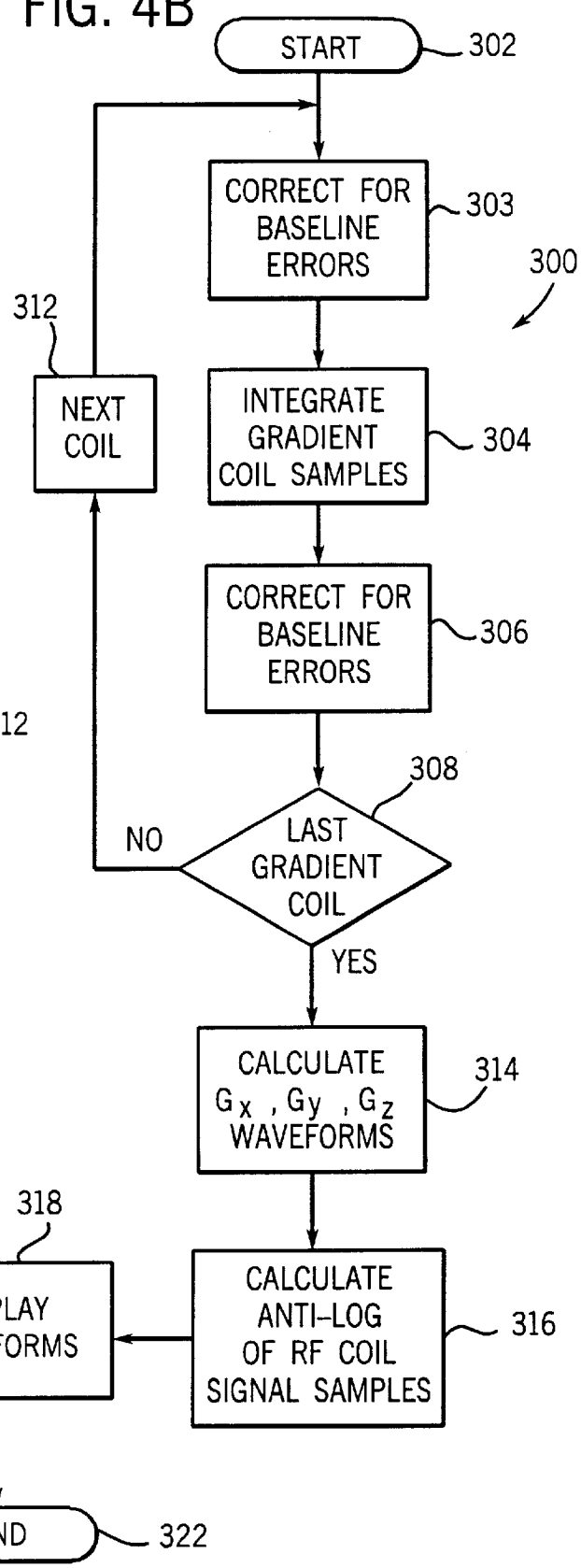

METHOD AND APPARATUS FOR EVALUATING SIGNALS PRODUCED IN A MAGNETIC RESONANCE IMAGING SYSTEM

BACKGROUND OF THE INVENTION

The present invention relates to a device and method for evaluating magnetic resonance (MR) imaging machines. More particularly, the invention relates to a device and method for determining the gradient magnetic field and radio frequency (RF) pulses of an MR pulse sequence in an MR imaging machine.

The gradient magnetic field and RF pulse sequence of an MR imaging machine are unique for a given machine manufacturer, and even for given machine models made by a specific machine manufacturer. Therefore, proper evaluation of an MR imaging machine requires accurate determination of these pulse sequences.

Presently, the MR pulse sequences can be determined only by utilizing software-based predictions of pulse sequence parameters, or by measuring the signals directly using test equipment. Because the software only provides pulse sequence predictions, this method is not sufficiently accurate. Moreover, it requires special software and hardware interaction with the MR imaging machine under evaluation. Measuring the signals directly provides a fairly accurate method of determining the pulse sequence; however, this method also requires physically connecting external test equipment to the MR imaging machine under test. Since many MR imaging machines do not provide test ports designed for test equipment connection, these machines must be opened up to allow the equipment to be connected. Thus, this method presents potential hazards for both the MR imaging machine and testing personnel.

BRIEF SUMMARY OF THE INVENTION

The present invention is a coil assembly having a plurality of magnetic field induction coils mounted to a frame along with a radio frequency (RF) detection coil and a processor which connects to these coils and samples their signals. The frame is positioned in the bore of an MRI system to detect the gradient magnetic fields and RF field produced during a scan, and the processor displays the gradient and RF field waveforms of the pulse sequence being performed by the MRI system. All three gradient waveforms can be displayed.

BRIEF DESCRIPTION OF THE DRAWINGS

In the following detailed description, reference will be made to the attached drawings in which:

FIGS. 4A and 4B are flowcharts depicting the steps performed by the workstation of FIG. 2.

DETAILED DESCRIPTION OF THE INVENTION

Figure 1:
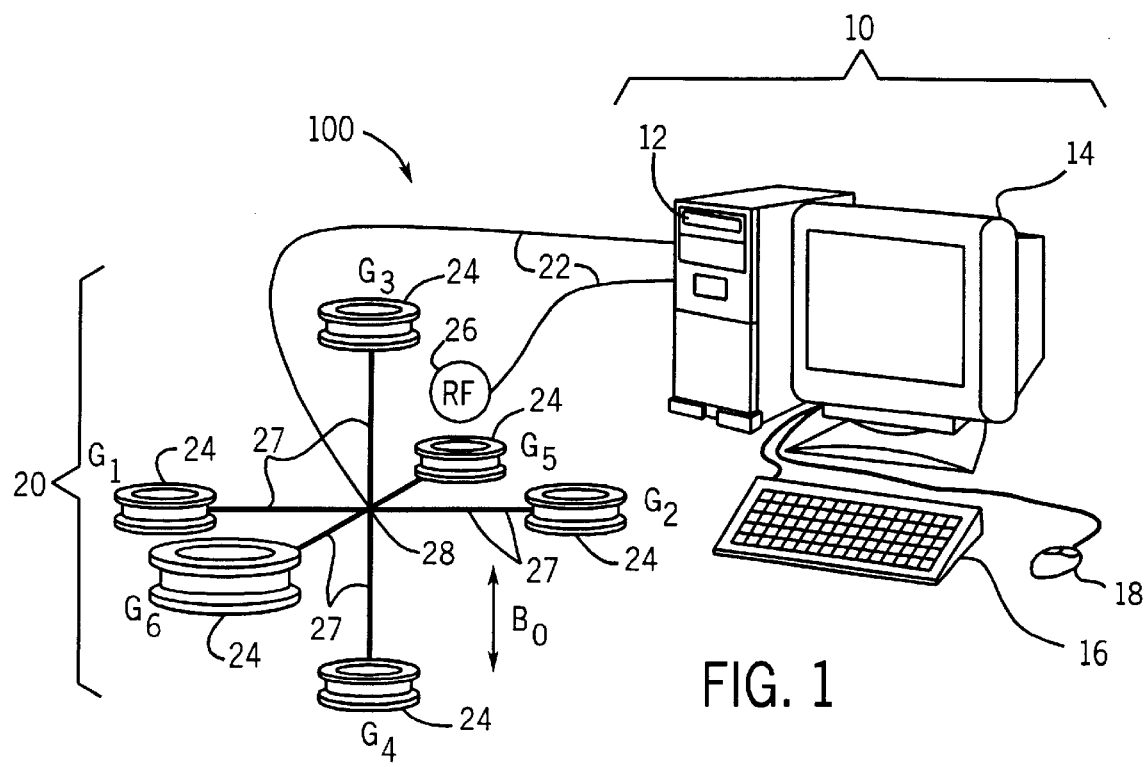
FIG. 1 is a perspective view of a detector coil assembly connected to a workstation that has been modified to process the signals produced by the coil assembly.

FIG. 1 depicts a preferred embodiment of a system 100 for carrying out the present invention. The system 100 includes a workstation 10 connected to a detector coil assembly 20. The workstation 10 includes a central processing unit (CPU) housing 12, which houses, among other things, a processor and associated circuitry, memory, and peripheral device interface circuits, all of which are further described below. The peripheral devices connected to the CPU housing 12 include a display device 14, a keyboard 16, and a mouse 18. The display device 14 is preferably a commercially available cathode ray tube (CRT), but could also be a liquid crystal display (LCD), a gas plasma display. Moreover, it will be appreciated that the CPU housing 12, display 14, keyboard 16, and mouse 18, could all be integrated together into a single housing, such as in a laptop-type computer, as is well known in the art.

The detector coil assembly 20 connects to the CPU housing 12 via a plurality of cables 22, which are preferably coaxial cables. The detector coil assembly 20 includes three pairs of magnetic field induction coils 24 and a radio frequency (RF) detection coil 26. The coils 24 and 26 are mounted to a supporting frame 27 which enables the coil assembly 20 to be placed inside the bore of an MRI system near its isocenter, while maintaining the coils 24 and 26 in their fixed relationship. The frame 27 is aligned to the extent practical such that the three coil axes line up with the three gradient field axes (e.g., x, y, z) of the MR imaging machine. The six magnetic field induction coils 24 are spaced equidistant (preferably 15 cm) from a central reference point 28 to detect magnetic field gradient pulses directed along three orthogonal axes. The central reference point 28 serves as the origin in the Cartesian coordinate system for the coil system and, as illustrated, the six induction coils are located along plus and minus locations of each of its x, y, and z axes.

The RF detection coil 26 is mounted to the frame 27, but its physical location within the assembly 20 is not similarly constrained. The skilled artisan will appreciate that the present invention is not limited to six magnetic field induction coils. Rather, the present invention encompasses the use of various numbers of magnetic field induction coils spaced apart from the reference point 28. Indeed, two, three, or four coils could be employed for detecting magnetic field gradient pulses directed along one, two, or three axes, depending upon the desired accuracy. By way of non-limiting example, two coils spaced substantially equidistantly along a single axis will allow accurate determination of the magnetic field gradient along the single axis. However, it will be appreciated that two coils spaced substantially equidistantly from the reference point 28, but in different axes, could allow determination of the magnetic field gradients along the two axes, albeit with less accuracy. Moreover, three coils arranged in an equilateral triangle arrangement will allow accurate determination of the magnetic field in two axes, and four coils arranged in a tetrahedral arrangement will allow accurate determination of the magnetic fields in three axes. It will be further appreciated that four coils, each spaced substantially equidistantly from the reference point 28, along two axes (at plus and minus positions), will allow accurate determination of the magnetic fields in the two axes.

Figure 2:
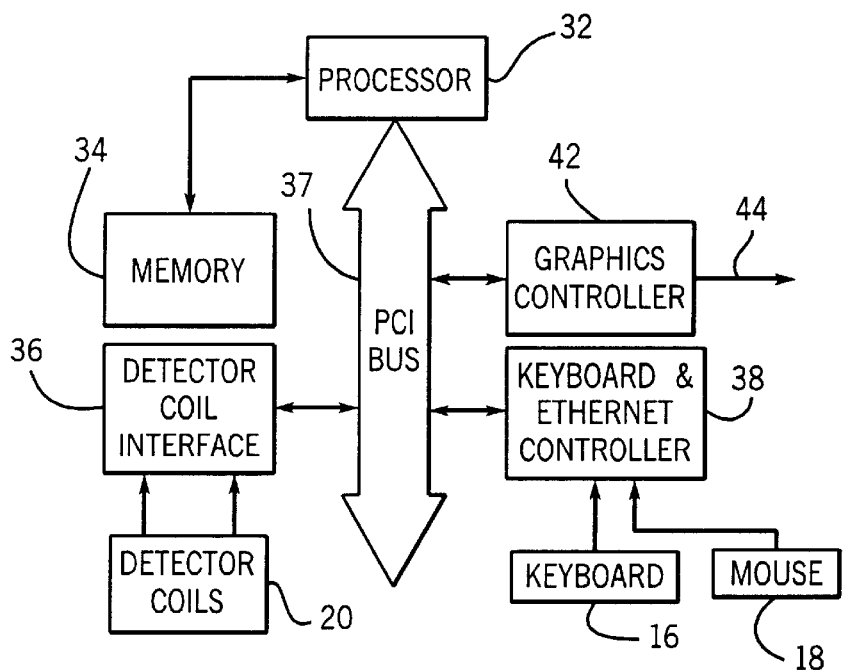
FIG. 2 is a block diagram of a preferred embodiment of the workstation depicted in FIG. 1.

The workstation 10, as shown in FIG. 2, includes a processor 32 which executes program instructions stored in a memory 34. The processor 32 is preferably a commercially available device that incorporates on-chip memory and input-output (I/O) control to facilitate system management. The processor 32 also preferably includes an integral PCI bus driver which provides a direct interface with a PCI bus 37, and an integral memory management circuitry for handling all external memory 34.

The PCI bus 37 is an industry standard bus that transfers data between the processor 20 and various peripheral controller cards. The various peripheral controller cards include a detector coil interface 36, an Ethernet controller 38, and a graphics controller 42. The detector coil interface 36 connects the detector coil assembly 20 to the PCI bus 37. The keyboard 16 and Ethernet controller 38 support data transfer from the keyboard 16 and mouse 18, while the graphics controller 42 couples the PCI bus 37 to the display device 14 via a standard graphics connection 44.

Figure 3:
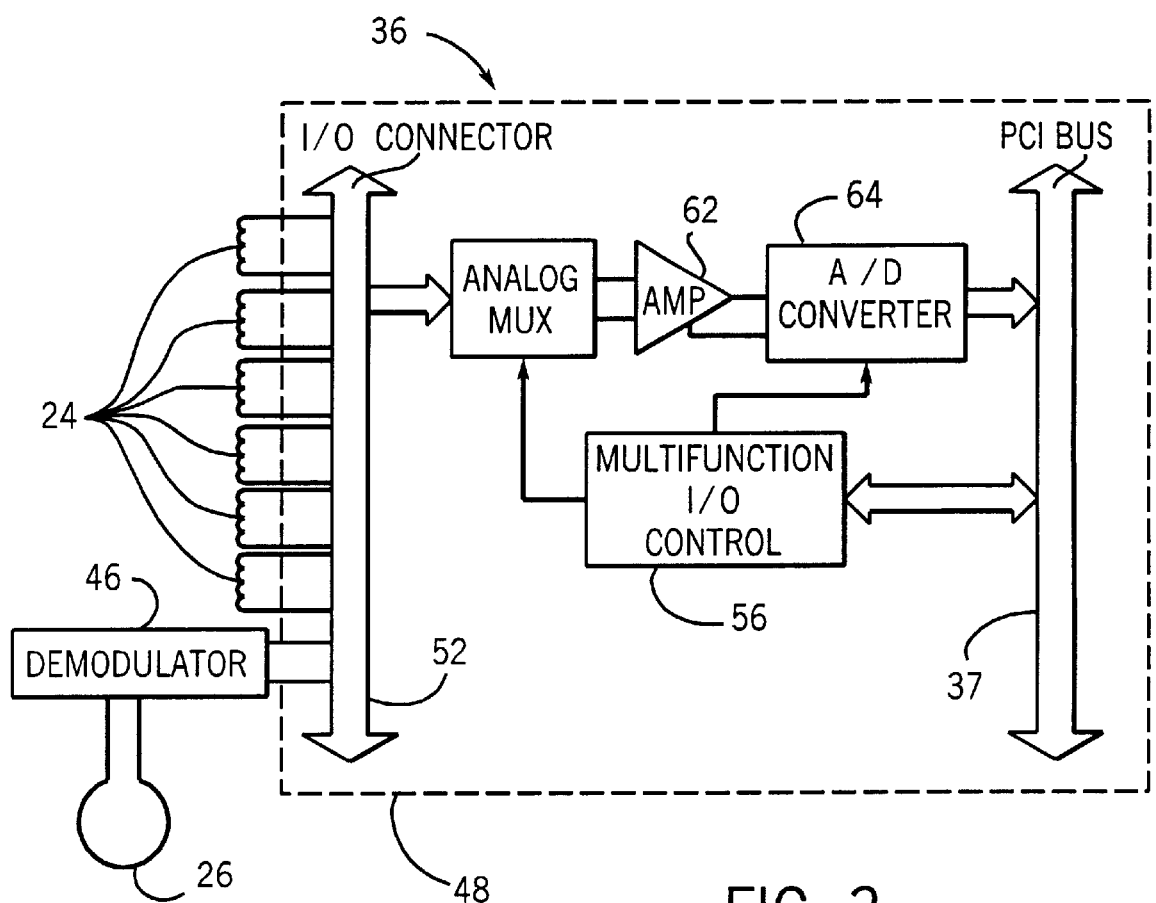
FIG. 3 is a block diagram of a preferred embodiment of a detector coil interface which forms part of the workstation of FIG. 2.

Turning now to FIG. 3, a more detailed description of the magnetic field induction coils 24, RF detection coil 26, and detector coil interface 36 will be provided.

The detector coil interface 36 includes a demodulator 46 and an I/O interface 48. The demodulator 46 is connected between the I/O interface 48 and the RF detection coil 26. The RF detection coil 26 functions essentially as an antenna designed to pick up the RF pulses transmitted during an MR imaging pulse sequence and it presents the pulses as detected RF voltages. Because MR imaging uses high power RF pulses, it is not necessary to use a tuned antenna device. Rather, in the preferred embodiment, the RF detection coil 26 is a simple RF detection loop, comprising a loop of wire of approximately 1 to 2 inches in diameter. The skilled artisan will appreciate that other antenna configurations, both tuned and non-tuned, could be used to carry out the present invention.

The high frequency RF pulses transmitted during MR imaging pulse sequences make direct sampling of detected RF voltages difficult, or in certain instances unfeasible, if conventional analog-to-digital (A/D) converters are used. Although high-speed A/D converters exist that will allow for the direct sampling of the detected RF voltages, such devices add to the cost and complexity of the system. Thus, in a preferred embodiment of the present invention, the demodulator 46 receives the detected RF voltages from the RF detection coil 26 and demodulates the pulses down to a lower frequency. This allows the detected RF voltages to be accurately sampled, to thereby detect the RF pulse waveforms. In the preferred embodiment, the demodulator 46 is a logarithmic amplifier, which detects the signal envelope of the RF pulses and provides an output to the I/O interface 48 that is proportional to the logarithm of the signal envelope. The ordinarily skilled artisan will appreciate that other demodulation devices and methods can also be used to demodulate the detected RF voltages. Such non-limiting examples include simple diode detection demodulation, or the conventional RF receiver methodology of mixing the RF pulses with a demodulating carrier frequency.

The magnetic field induction coils 24 each produce a voltage (V(t)) proportional to the rate of change of the magnetic field (dB/dt) to which each is exposed. It has been determined that coils constructed of 200 turns of copper wire with a radius of 1-inch are useful for field induction coils. Importantly, this relationship holds true only when the current induced in each coil is at or near zero, meaning a very high (effectively infinite) coil-detector impedance. Moreover, because the magnetic field induction coils 24 are in a strong polarizing magnetic field, any coil motion may produce post-processing error signals proportional to the change in the polarizing magnetic field passing through the coils 24. For example, the magnetic field gradient pulses themselves may cause unwanted vibratory motion. Therefore, the magnetic field induction coils 24 should be mechanically restrained by their supporting frame 27 to avoid such vibratory motion during the detection process.

The I/O interface 48 portion of the detector coil interface 36 is preferably a commercially available multi-function I/O device. The I/O interface includes an I/O connector 52 for receiving an input from each of the magnetic field induction coils 24, and from the RF detection coil 26 via the demodulator 46. A multiplexor 54 is connected to the I/O connector 52 and, under control of a multifunction I/O controller 56, selectively transmits the voltage induced in one of the magnetic field induction coils 24, or the demodulated RF voltage pulses from the demodulator 46, to an amplifier 62. The amplifier 62 amplifies the received voltage signal and transmits it to an analog-to-digital (A/D) converter 64. The A/D converter 64 synchronously samples the amplified induced gradient voltages and the demodulated RF voltage pulses, so that the RF voltage pulses are time-registered with the induced gradient voltages to fully define the pulse sequence. The sampled voltages are then transmitted to the PCI bus 37 for processing in the processor 32.

Having discussed the hardware used for carrying out the invention, the methodology for carrying out the preferred embodiment of the invention will now be described. Before proceeding to a discussion of the overall methodology, a brief, more detailed discussion of the theory behind the methodology for detecting the gradient magnetic fields that define an MR pulse sequence will first be provided.

As is known, changing the magnetic gradient fields (dG/dt) in the bore of an MRI system changes the total magnetic field (dB/dt) at all locations in the bore of the MRI system, except at the system's isocenter. In the three dimensional Cartesian coordinate system of the MRI system, if we consider only an X-gradient and the z-component of the total field (B field), the following relationship holds true:

$$\frac{dB}{dt} = x \frac{dG_x}{dt},$$

where x is the location in the x-direction and the magnetic isocenter of the MRI system is defined as x=0. It is also known that if a conductor is placed in a changing magnetic field at a particular location, then a voltage will be induced in the conductor, and the magnitude of the induced voltage will be proportional to the rate of change of the magnetic field. Thus, if a coil of wire is placed at location x from its isocenter, a voltage V(t) will be induced in the coil according to the following relationship $$V(t) \propto \frac{dB}{dt}(t) = x \frac{dG_x}{dt}(t).$$

From this relationship, it is clear that the integral of the voltage signal (V(t)) is proportional to $G_x$, or expressed mathematically:

$$\int V(t) \propto B(t) = x G_x(t),$$

which, upon solving for the gradient field, yields:

$$G_x(t) \propto \frac{1}{x} \int V(t).$$

Of course, the above-described solution assumes only a single gradient field at any time, and that the coil location is known. In practice, however, any combination of the three orthogonal gradients G(x, y, z) may be active at any given time in an MR imaging machine. Moreover, the position (x, y, z) of a coil relative to the magnetic isocenter of the MRI system is unlikely to be known a priori. Hence, with a single coil, there is insufficient information to determine G(x, y, z) from V(t). That is why, as described previously, the present invention employs a plurality of magnetic field induction coils. Also, as described previously, the invention preferably employs six coils, with one coil each located equidistant from a reference point along each of the plus and minus locations of the x, y, and z axes. From the six voltages $V_i(t)$ (i=1, 2, 3 . . . 6), it is possible to solve for the gradient fields G(x, y, z).

The preferred method of solving for the gradient fields from the six voltages employs an iterative fitting routine to minimize the error function:

$$\sum_{n=1}^{p} \varepsilon_n^2,$$

where, $$\xi n = V_n(t) - \{x_n(dG_x/dt) + y_n(dG_y/dt) + z_n(dG_z/dt)\},$$

p is the total number of the plurality of induction coils, $V_n(t)$ is the voltage signal induced in the n-th induction coil, $G_x$, $G_y$, and $G_z$ are the magnetic gradient fields, and $x_n$, $y_n$, and $z_n$ are the positions of each of the n-th induction coils along the ±x, ±y, and ±z axes, respectively.

For example, a simplex method of function fitting by error function minimization may used. The simplex method is well known in the art of numerical curve fitting for its ability to fit arbitrary functions by numerically searching for a minimum to a user defined error function. Other methods of numerical curve fitting may also be employed in this step of solving for the gradient fields. With this iterative routine, if the coil positions ($x_n$, $y_n$, $z_n$) are known, or at least approximately known, then these positions can be entered as initial guesses to constrain the fitting algorithm. Additionally, if it is known that one or more gradient fields is zero for certain periods of time (such as during a slice selection gradient or readout gradient), then this can also be entered as initial guesses for the gradient fields, to further constrain the fitting algorithm.

Of course, as was similarly discussed in the hardware description, the skilled artisan will appreciate that the above-described solution is not constrained to the use of six magnetic field induction coils. Rather, six coils is preferred to increase the accuracy and processing speed of a solution for three dimensional gradient fields. If only one or two dimensional gradient fields are present or, in some instances, if less accuracy is allowable, then only two, three, or four coils need be employed. Moreover, the iterative fitting routine would be modified to reflect the number of coils and dimensions.

Turning now to FIGS. 4A and 4B, the overall methodology for carrying out the present invention will be discussed. Reference should be made to FIGS. 1–3, as necessary. In the following discussion, the steps indicated in parentheses correspond with applicable flowchart steps in FIGS. 4A and 4B.

When the system 100 is placed in the MR imaging system and a pulse sequence is performed, the system 100 is initialized to first carry out a sampling process 200. Upon entry (STEP 202) of the sampling process 200, the signals detected by each of the magnetic field induction coils 24 and the RF detection coil 26 are sampled (STEP 204) one by one and stored in memory (STEP 206). This process continues (STEP 212) until all of the coils 24, 26 have been sampled (STEP 208). Thereafter, the sampling process is ended (STEP 214), and a signal processing and waveform generation process 300 is initiated (STEP 302).

The first step of the signal processing and waveform generation process 300 is to correct the signal sample for baseline errors (STEP 303). More specifically, the signal induced in each of the magnetic field induction coils 24 may include various DC and other low frequency components. If these low frequency components were not removed from the integrated voltage signals, the resulting waveforms would exhibit an undesirable linear slope. Thus, to avoid such display error, these low frequency components are removed from the integrated signals by curve fitting a low frequency and DC term to the input data, and subtracting it from the signal, using any one of several techniques known in the art. Following this initial baseline correction, each of the magnetic field induction coil signal samples is integrated (STEP 304), as discussed above. Then, after the integration step, the signal sample is once again corrected for baseline errors (STEP 306). The baseline error correction is performed a second time to compensate for any minor residual errors that may remain after the integration. This process is repeated for each magnetic field induction coil signal sample (STEP 312) until each coil sample has been integrated and corrected (STEP 308). Thereafter, the integrated and corrected induction coil signal samples are processed, preferably using the above-described iterative fitting method, to determine the magnetic field gradients $G_x$, $G_y$, and $G_z$ along each axis (STEP 314).

Once the magnetic field induction coil signals have been fully processed, then the RF detection coil signal sample is processed (STEP 316). More specifically, as discussed previously, the demodulated RF detection coil signal is sampled to provide the signal envelope of the RF pulse produced by the MRI system.

Figure 5:
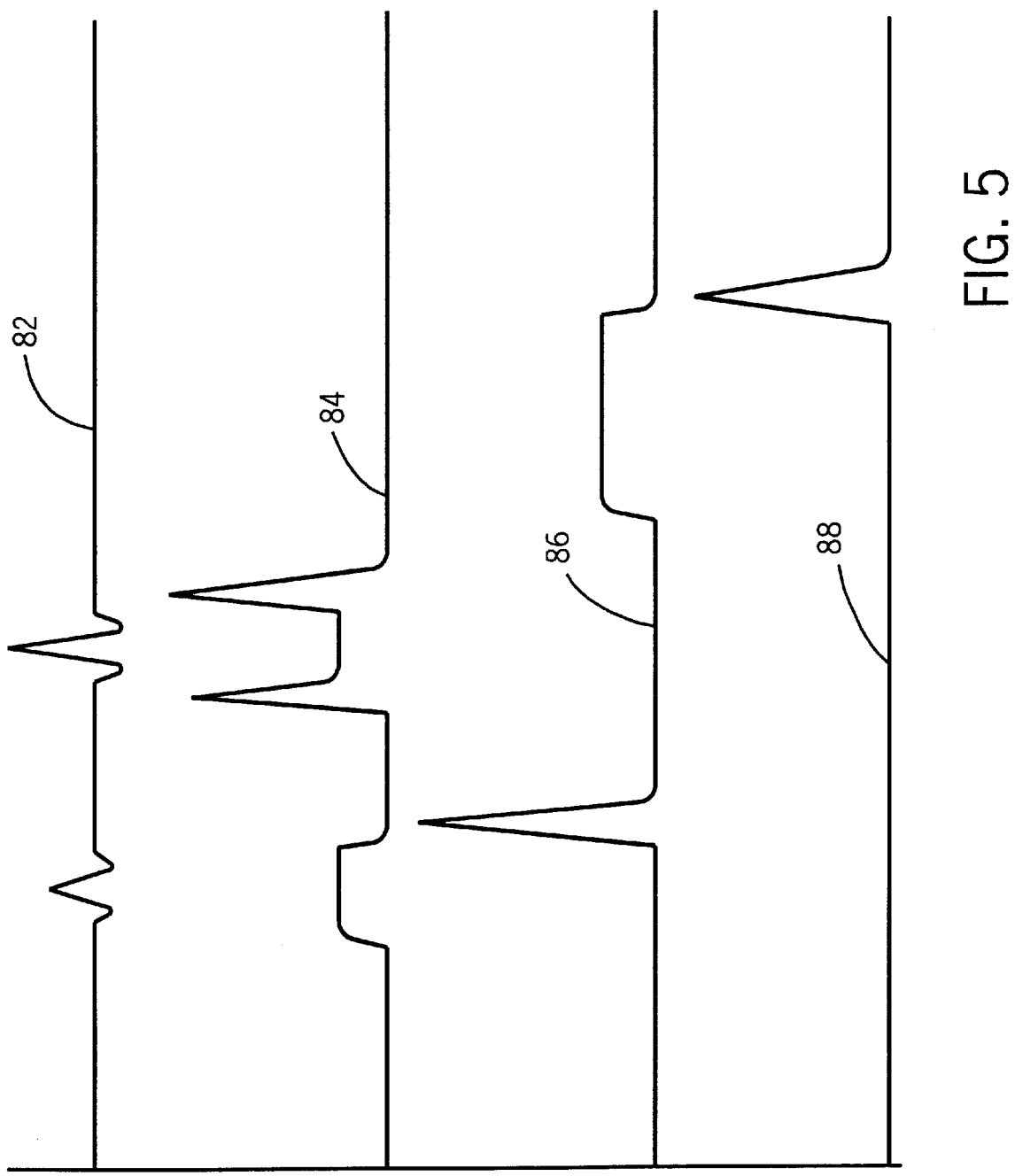
FIG. 5 is an example of pulse sequence waveforms produced by the workstation of FIG. 2 according to the present invention.

Finally, after the sampled magnetic field induction coil and RF detection coil signal samples have been processed, the resulting waveforms are displayed on the display device 14 (STEP 318), and the routine ends (STEP 322). For an example of pulse sequence waveforms displayed on the display device 14 according to the present invention, reference should be made to FIG. 5. This figure illustrates the waveforms for a "Spin Echo" pulse sequence, and includes an RF pulse waveform 82, a slice selection gradient waveform 84, a readout (or "frequency encoding") gradient waveform 86, and a phase encoding gradient waveform 88. Since the signals produced by the detector coil assembly 20 are sampled substantially simultaneously, the relative timing of the different waveforms is maintained during the processing. As a result, the displayed waveforms accurately reveal along the horizontal time axis their relative timing.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for evaluating the fields produced by an MRI system which comprises:

a coil assembly for placement in the fields produced by the MRI system, the coil assembly including:

a) a frame;

b) a first pair of magnetic field induction coils mounted to the frame and disposed along a first gradient field axis, the magnetic field induction coils producing a voltage signal proportional to the rate of change in the magnetic fields produced by the MRI system to which the magnetic field induction coils are exposed; and c) a radio frequency (RF) detection coil mounted to the frame, the RF detection coil picking up RF pulses transmitted by the MRI system during an MR imaging pulse sequence and producing a voltage signal comprising RF pulses detected from the MR imaging pulse sequence produced by the MRI system;

a processor connected to each of the coils in the coil assembly and being operable to sample signals produced by the coils while the MRI system is operating and to solve for and reconstruct a first gradient waveform produced by the MRI system from the sampled signals from the first pair of magnetic field induction coils and an RF pulse waveform produced by the MRI system from the sampled signal from the RF detection coil; and a display for receiving the waveforms reconstructed by the processor and displaying them.

2. The system as recited in claim 1 in which the coil signals are sampled by the processor substantially simultaneously with respect to each other to maintain the relative timing therebetween, and the display depicts the first gradient waveform and the RF pulse waveform along a time line which depicts their relative timing.

3. The system as recited in claim 1 in which the coil assembly includes a second pair of magnetic field induction coils mounted to the frame and disposed along a second gradient field axis, the processor samples the signals produced by the second pair of magnetic field induction coils and produces a second gradient waveform therefrom, and then the display displays the second gradient waveform.

4. The system as recited in claim 3 in which the coil assembly includes a third pair of magnetic field induction coils mounted to the frame and disposed along a third gradient field axis, the processor samples the signals produced by the third pair of magnetic field induction coils and produces a third gradient waveform, and the display displays the third gradient waveform.

5. The system as recited in claim 4 in which the first, second and third gradient field axes are perpendicular to each other and the magnetic field induction coils in each pair are disposed along their respective axis substantially equidistantly and on opposite sides of a central reference point in the frame.

6. The system as recited in claim 5, wherein the central reference point is a magnetic isocenter of the MRI system.

7. The system as recited in claim 1, further comprising a data storage device for receiving and storing data representative of the waveforms produced by the processor.

8. The system as recited in claim 1, wherein the RF detection coil comprises a single loop of wire.

9. The system as recited in claim 1, further comprising: a demodulator connected between the RF detection coil and the processor and being operable to demodulate low frequency pulses from RF voltage pulses induced in the RF detection coil.

10. The system as recited in claim 9, wherein the demodulator comprises a logarithmic amplifier circuit.

11. The system as recited in claim 9, wherein the demodulator comprises a diode-detection demodulator.

12. The system as recited in claim 9, wherein the demodulator comprises:

an RF receiver connected to receive the RF voltages received by the RF detection coil;

a carrier frequency generator providing a carrier frequency output; and mixer circuitry connected to receive (1) an output from the RF receiver and (2) the carrier frequency output from the carrier frequency generator, and provide a demodulated output.

13. A method for evaluating the magnetic fields produced by an MRI system as it performs a scan, the steps comprising:

placing a pair of magnetic field induction coils and a radio frequency (RF) detector coil in a location within the MRI system where the magnetic fields are produced during the scan;

sampling substantially simultaneously the signals induced in the coils during the scan to obtain samples proportional to the gradient magnetic fields produced by the MRI system;

processing the sampled signals from the pair of magnetic field induction coils to solve for and reconstruct a gradient field waveform produced by the MRI system;

processing the sampled signal from the RF coil to reconstruct an RF pulse waveform produced by the MRI system; and displaying the gradient field waveform and the RF pulse waveform provided by the MRI system during the scan along a common time line to depict their relative timing.

14. The method recited in claim 13, further comprising: storing data representative of the gradient field and RF pulse waveforms in a memory storage device.

15. The method as recited in claim 13, further comprising:

placing a second pair of magnetic field induction coils within the MRI system;

sampling substantially simultaneously the signals induced in the second pair of magnetic field induction coils;

processing a second gradient waveform therefrom; and displaying the second gradient waveform.

16. The method as recited in claim 15, further comprising:

placing a third pair of magnetic field induction coils within the MRI system;

sampling substantially simultaneously the signals induced in the third pair of magnetic field induction coils;

processing a third gradient waveform therefrom; and displaying the third gradient waveform.

17. The method as recited in claim 14, wherein the step of processing the sampled signals from the pair of magnetic field induction coils, comprises:

integrating voltage signals induced into the pair of magnetic field induction coils; and iteratively minimizing an error function using (1) the integrated voltage signals and (2) estimates of positions of the pair of magnetic field induction coils.

18. The method as recited in claim 17, wherein the error function satisfies the following relationship:

$$\sum_{n=1}^{p} \varepsilon_n^2$$

where, $\xi_n = V_n(t) - \{x_n(dG_x/dt) + y_n(dG_y/dt) + z_n(dG_z/dt)\}$, p is the total number of the plurality of induction coils,
$V_n(t)$ is the voltage signal induced in the n-th induction coil,
$G_x$, $G_y$, and $G_z$ are the magnetic gradient fields, and
$x_n$, $y_n$, and $z_n$ are the positions of each of the n-th induction coils along the $\pm x$, $\pm y$, and $\pm z$ axes, respectively.

19. The method as recited in claim 17, further comprising:
correcting the integrated voltage signals for baseline errors.

20. The method as recited in claim 13, wherein the step of processing the sampled signal from the RF coil comprises demodulating lower frequency pulses from the generated RF pulses.

* * * * *